United States Patent [19]
Chung

[11] Patent Number: 5,940,333
[45] Date of Patent: Aug. 17, 1999

[54] RECURSIVE VOLTAGE BOOSTING TECHNIQUE

[75] Inventor: Michael S.C. Chung, San Jose, Calif.

[73] Assignee: Advanced Micro Devices, Inc., Sunnyvale, Calif.

[21] Appl. No.: 09/111,939

[22] Filed: Jul. 8, 1998

[51] Int. Cl.$^6$ ........................................................ G11C 7/00
[52] U.S. Cl. ............................... 365/189.09; 365/189.11; 365/230.06
[58] Field of Search .......................... 365/189.11, 189.09, 365/230.06, 226, 149

[56] References Cited

U.S. PATENT DOCUMENTS 5,396,463  3/1995  Kim et al. ........................... 365/189.11
5,499,217  3/1996  Pascucci et al. .................... 365/230.06

*Primary Examiner*—Vu A. Le
*Attorney, Agent, or Firm*—Davis Chin

[57] ABSTRACT

A recursive voltage booster circuit is provided for generating a boosted output voltage to be higher than the low power supply potential to drive control gates via row decoder circuits and wordlines in an array of Flash EEPROM memory cells during a Read mode of operation. The voltage booster circuit includes a plurality of recursively connected boosting stages. The lower power supply potential has a voltage of +2.0 volts or lower. The boosted output voltage is significantly higher than what is traditionally available so as to enable reading of Flash EEPROM memory cells in a very low power supply voltage environment.

12 Claims, 3 Drawing Sheets

RECURSIVE VOLTAGE BOOSTING TECHNIQUE

BACKGROUND OF THE INVENTION

1. Field of the Invention

This invention relates generally to voltage booster circuits. More particularly, it relates to an improved voltage booster circuit which includes a plurality of recursively connected boosting stages for generating a boosted output voltage to drive control gates via row decoder circuits and wordlines in an array of Flash EEPROM memory cells during a read mode of operation.

2. Description of the Prior Art

As is generally known in the area of memory devices and other semiconductor integrated circuits, there is often required voltages to be internally generated (on-chip) that are greater than an external or off-chip power supply potential which is supplied to it. For example, it is known that in Flash electrically erasable, programmable read-only memories (EEPROMs) a high voltage of approximately +5.0 volts is needed to be generated for the reading mode of operation of the Flash memory cells. As a result, such semiconductor memories will also typically include an internal voltage boosting circuit of some type for generating an output voltage which is boosted to be higher than an external power supply voltage.

One known prior art voltage boosting circuit for generating an on-chip voltage higher than the power supply potential utilizes a single bootstrapping stage which is responsive to a single pulse. In FIG. 1, there is shown a schematic circuit diagram of this prior art single stage voltage boosting circuit 10 for generating a boosted output voltage $V_{OUT}$ which is delivered via appropriate row decoder circuits 11 and wordlines WL0 ... WLn to control gates in an array of Flash EEPROM memory cells.

The boosting circuit 10 includes a pre-charge portion 12 and a bootstrap portion 14. The pre-charge portion 12 is formed of a level-shifting CMOS inverter 16 and a P-channel pre-charge MOS transistor MPS1. The bootstrap portion 14 is formed of a P-channel MOS transistor MP1, an N-channel MOS transistor MN1, and a bootstrap capacitor $C_1$. In addition, there is provided a CMOS inverter 18 and a load capacitor $C_{S1}$. The input of the inverter 18 is connected to an input terminal 19 for receiving a single pulse BOOST of a predetermined duration. The load capacitor $C_{S1}$ represents all of the stray or parasitic capacitances associated with the lead line 20 connected between the output node 22 and the ground potential VSS. The output node 22 is also connected to an output terminal 24 for providing the boosted output voltage $V_{OUT}$.

In operation, when the input pulse BOOST is low the output voltage $V_{OUT}$ at the output terminal 24 will be precharged to the external power supply potential VDD since the P-channel precharge transistor MPS1 will be turned on. When the pulse BOOST makes a low-to-high transition, the precharge transistor MPS1 will be quickly turned off and the internal node A will also undergo a low-to-high transition of a magnitude equal to the off-chip power supply potential VDD. This will, in turn, cause the output voltage $V_{OUT}$ at the output terminal 24 to be raised or bootstrapped by the boost voltage $V_A$ at the internal node A via the bootstrap capacitor C1.

Since a fraction of the boost voltage $V_A$ is coupled to the output node 22 and is added to the initial precharged voltage $V_{DD}$, the boosted output voltage $V_{OUT}$ can be calculated from the following equation:

$$V_{OUT} = V_{DD} + \frac{C_1}{C_1 + C_{SI}} \times V_A \qquad (1)$$

where:

$V_{DD}$=power supply potential VDD  (2)

$V_A$=input pulse peak VDD  (3)

By substituting equations (2) and (3) into equation (1) and simplifying, there is given:

$$V_{OUT} = VDD\left(1 + \frac{C_1}{C_1 + C_{SI}}\right) \qquad (4)$$

From above equation (4), it can be seen that if the required maximum for the control gate voltage in the array of Flash memory cells is less than the level that can be generated by the boosting circuit 10 of FIG. 1, then the prior art boosting circuit 10 will be able to operate sufficiently. However, in view of the trend for deep-submicron CMOS technology of using a low power supply voltage (i.e., VDD is less than +2.0 volts), the prior art boosting circuit 10 will be unable to adequately supply sufficient control gate voltage for reading the memory cells in the Flash EEPROM memory array since the typical voltage required for reading is approximately +5.0 volts. Assuming that the capacitance value $C_1$ is much greater than the capacitance value $C_{S1}$, then $V_{OUT}$ is approximately +4.0 volts. Therefore, in a very low power supply voltage environment, additional means is needed for generating this high output voltage.

The inventor of the present invention has developed a simple and novel technique of utilizing the single stage boosting circuit of FIG. 1 so as to produce a boosted output voltage, which is significantly higher than what is traditionally available, for reading Flash EEPROM memory cells in a very low power supply voltage environment. This is achieved in the present invention by a voltage booster circuit which includes a plurality of recursively connected boosting stages for generating the boosted output voltage.

SUMMARY OF THE INVENTION

Accordingly, it is a general object of the present invention to provide an improved voltage booster circuit which overcomes all of the disadvantages of the prior art boosting circuits.

It is an object of the present invention to provide an improved voltage booster circuit which is capable of operating efficiently and effectively in a low power supply voltage environment.

It is another object of the present invention to provide an improved voltage booster circuit to produce a boosted output voltage which is significantly higher than what is traditionally available.

It is yet still another object of the present invention to provide an improved voltage booster circuit which includes a plurality of recursively connected boosting stages for generating a boosted output voltage.

In accordance with these aims and objectives, the present invention is concerned with the provision of a recursive voltage booster circuit for generating a boosted output voltage to be higher than a low power supply potential to drive control gates via row decoder circuits and wordlines in an array of Flash EEPROM memory cells during a Read mode of operation. The voltage booster circuit includes a plurality of recursively connected boosting stages each being connected together in a chain from a last stage to a first stage. Each boosting stage is formed of a precharge portion and a bootstrap portion. The precharge portion includes a level-shifting inverter and a precharge transistor responsive to a single input pulse for selectively connecting a low power supply potential to an output node.

The bootstrap portion includes a P-channel pull-up transistor, an N-channel pull-down transistor, and a bootstrap capacitor. The P-channel and N-channel transistor have their gates connected together at a first input node and have their drains connected together at an internal boost node. The P-channel transistor has its source connected to a second input node. The N-channel transistor has its source connected to a ground potential. The booster capacitor is interconnected between the internal boost node and the output node. A logic gate is interconnected between an input terminal for receiving the input pulse and the first input node. Time delay circuits are interconnected between the internal boost node and the logic gate circuit of a preceding boosting stage for delaying its boosting action at the boost node until a next preceding boosting stage has completed its boosting action. The second input node of each boosting stage except for the last boosting stage is connected to the respective output nodes of the preceding stage. The second input node of the last stage is connected to the lower power supply potential. The output node of the first boosting stage generates the boosted output voltage.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

In the following, there will be described embodiments of the present invention with reference to the drawings. There is illustrated in FIG. 2 of the drawings a schematic circuit diagram of a recursive voltage booster circuit 110, constructed in accordance with the principles of the present invention. The recursive voltage booster circuit 110 is comprised of two recursively connected boosting stages 110a and 110b for generating a boosted output voltage $V_{OUT}$. The boosted output voltage $V_{OUT}$ in FIG. 2 is significantly higher than what is traditionally available from FIG. 1. The recursive voltage booster generator circuit 110 is particularly useful in a very low power supply voltage environment in which the supply potential is less than +2.0 volts. When the power supply voltage is approximately +2.0 volts, the boosted output voltage $V_{OUT}$ of FIG. 2 will be higher than +5.0 volts, which is sufficient to drive the control gates so as to read the memory cells in the array of Flash EEPROM memory cells.

Figure 1:
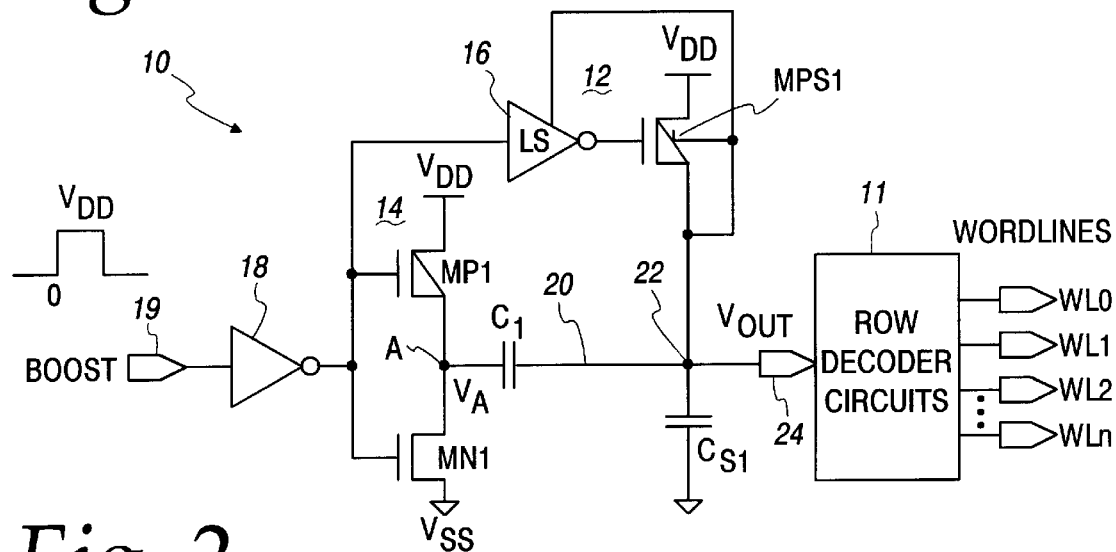
FIG. 1 is a schematic circuit diagram of a prior art single stage voltage boosting circuit.
Figure 2:
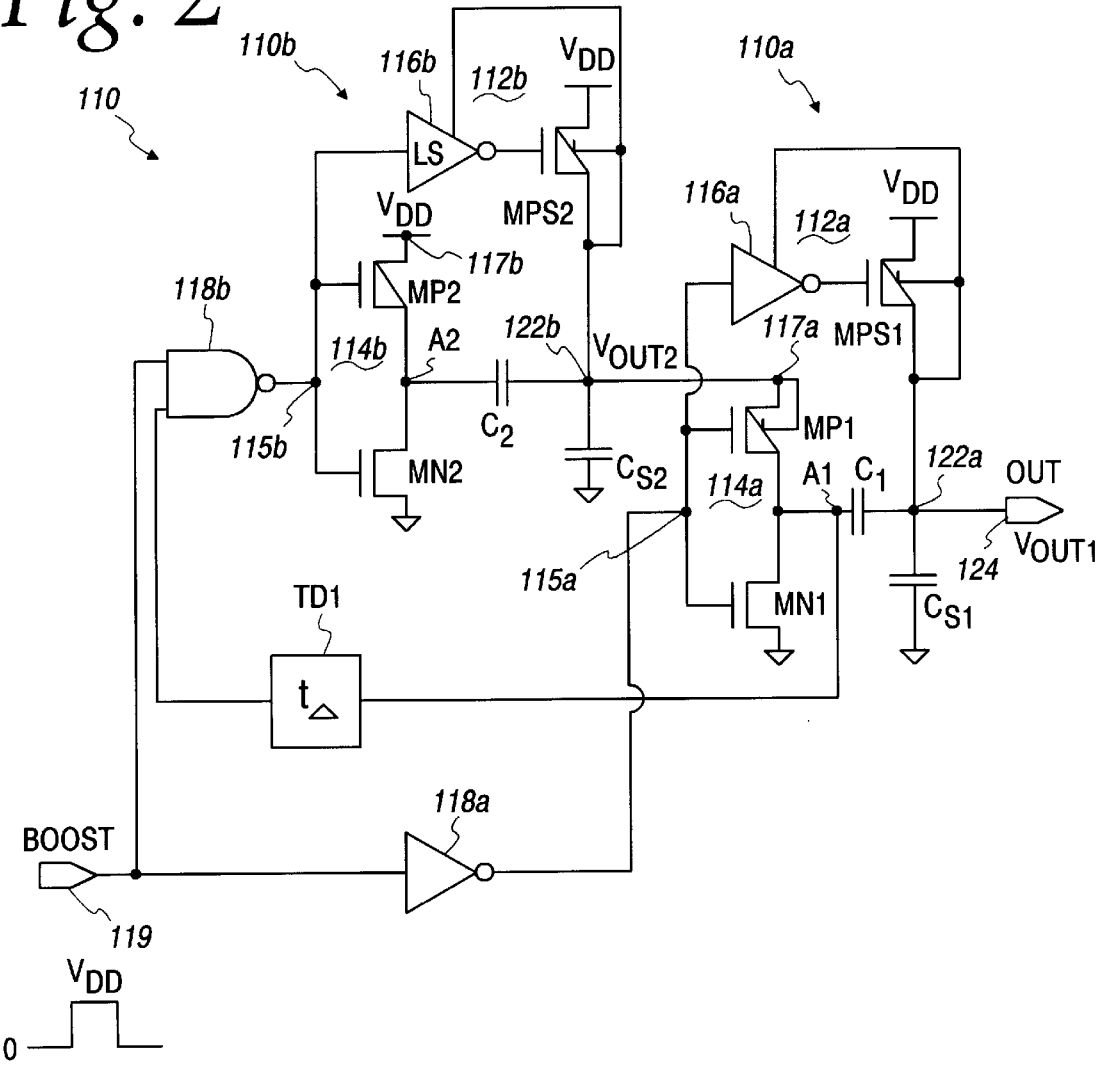
FIG. 2 is a schematic circuit diagram of a recursive voltage booster circuit having two boosting stages, constructed in accordance with the principles of the present invention.

As will be noted, each boosting stage 110a, 110b of FIG. 2 is identical in its construction to the voltage boosting circuit 10 of FIG. 1. The main differences are that the source at node 117a of the P-channel transistor MP1 in the bootstrap portion 114 of the first or output stage 110a is connected to the output node 122b of the preceding stage 110b rather than to the power supply potential VDD; the logic gate associated with the bootstrap portion 114b in the second stage 110b is replaced with a two-input NAND logic gate; and a time delay circuit TD1 is coupled between the internal boost node A1 of the first stage 110a and the second input of the NAND logic gate 118b.

In particular, the first or output boosting stage 110a includes a pre-charge portion 112a and a bootstrap portion 114a. The precharge portion 112a is formed of a level-shifting CMOS inverter 116a and a P-channel precharge MOS transistor MPS1. The bootstrap portion 114a is formed of a P-channel MOS pull-up transistor MP1, an N-channel MOS pull-down transistor MN1, and a bootstrap capacitor $C_1$. In addition, there is provided a logic gating element consisting of a CMOS inverter 118a and a load capacitor $C_{S1}$. The inverter 118a has its input connected to an input terminal 119 for receiving a single pulse BOOST of a predetermined duration and its output connected to the input of the level-shifting inverter 116a and to the common gates of the transistors MP1 and MN1 at a first input node 115a. The load capacitor $C_{S1}$ represents all of the stray or parasitic capacitance associated with the lead line 120a connected between the output node 122 and the ground potential VSS. A time delay network TD1 has its input connected to the boost voltage $V_A$ at the internal node A1. The source of the transistor MP1 is connected to a second input node 117a which is connected to the output node 122b of the second boosting stage 110b.

Similarly, the second boosting stage 110b includes a pre-charge portion 112b and a bootstrap portion 114b. The precharge portion 112b is formed of a level-shifting CMOS inverter 116b and a P-channel precharge MOS transistor MPS2. The bootstrap portion 114b is formed of a P-channel MOS pull-up transistor MP2, an N-channel MOS transistor pull-down MN2, and a bootstrap capacitor $C_2$. In addition, there is provided a logic gating element consisting of a NAND logic gate 118b and a load capacitor $C_{S2}$. The NAND logic gate 118b has its first input connected to the input terminal 119 for receiving the single pulse BOOST and its output connected to the input of the level-shifting inverter 116b and to the common gates of the transistors MP2 and MN2 at a first input node 115b. The load capacitor $C_{S2}$ represents all of the stray or parasitic capacitances associated with the lead line 120b connected between the output node 122b and the ground potential VSS. The time delay network TD1 has its output connected to the second input of the NAND logic gate 118b. The source of the transistor MP2 is connected to a second input node 117b which is connected to the supply potential VDD.

Figure 4:
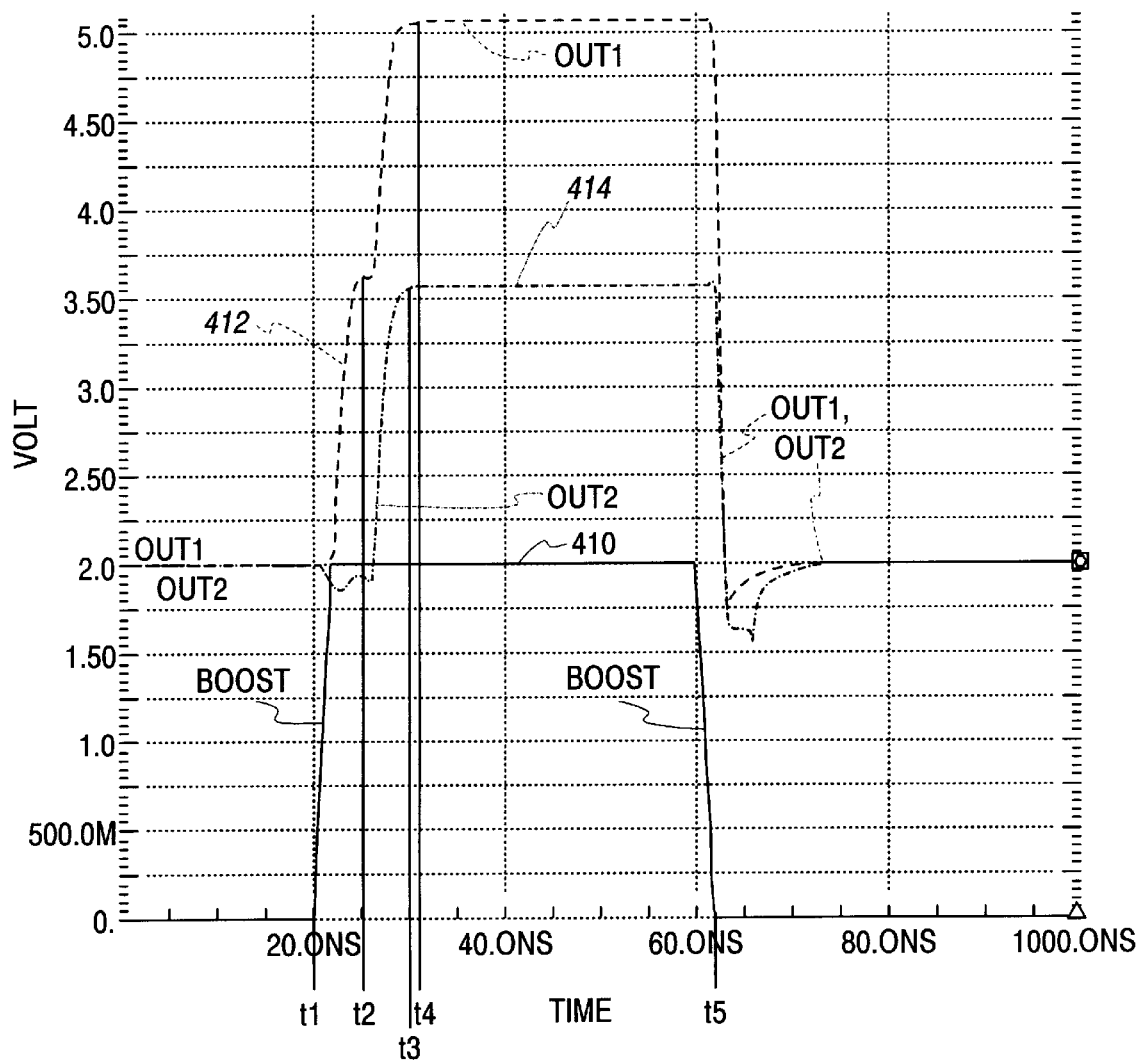
FIG. 4 are waveforms of the voltages at various points in the circuit of FIG. 2, useful in explaining the operation of the present invention.

The operation of the two-stage recursive voltage booster circuit 110 of FIG. 2 will now be explained with reference to the waveforms of FIG. 4. Initially, it is assumed that prior to the time t1 the input pulse BOOST (curve 410) at the input terminal 119 is low (VSS). Thus, the output of the inverter 118a will be high (VDD) so as to turn on the pull-down transistor MN1 in the bootstrap portion 114a of the first stage 110a, causing the node A1 to be low (VSS). Also, the output of the level-shifting inverter 116a will be low (VSS)

so as to turn on the precharge transistor MPS1, thereby pulling the output node to a high level VDD. Therefore, the output voltage $V_{OUT1}$ (curve 412) at the output terminal 124 will be at VDD or +2.0 volts prior to the time t1.

In the second stage 110b, the output of the NAND logic gate 118b will be high (VDD) so as to turn on the pull-down transistor MN2 in the bootstrap portion 114b, causing the node A2 to be low (VSS). Also, the output of the level-shifting inverter 116b will be low (VSS) so as to turn on the precharge transistor MPS2, thereby pulling the output node 122b to a high level VDD. As a result, the output voltage $V_{OUT2}$ (curve 414) at the output node 122b will also be at +2.0 volts prior to the time t1.

When the input pulse BOOST makes a low-to-high transition at the time t1, the pull-up transistor MP1 in the first stage 110a will be turned on allowing the output voltage $V_{OUT2}$ of the second stage 110b connected to its source at node 117a to pass therethrough to the internal node A1. A fraction of this output voltage $V_{OUT2}$ (+2.0 volts) is coupled to the output node 122a, causing the output voltage $V_{OUT1}$ to be raised or boosted to about +3.6 volts at the time t2. Since the boost voltage at the internal node A1 is delayed by the time delay network TD1, the output of the NAND logic gate 118b will remain at a high level. As a result, the output voltage $V_{OUT2}$ will still be maintained at +2.0 volts at the time t2.

However, after a predetermined time delay the output of the time delay network TD1 will go high (VDD). The predetermined time delay is selected to be long enough so that the previous or first stage 110a in this case, has completed its boosting action. This serves to improve the boosting efficiency of each stage. When the output of the time delay network TD1 goes high (VDD) at time t2, it is assumed that the input pulse BOOST is still high. It should be noted that the input pulse duration (the time it is high) must be sufficiently long so as to allow all stages to complete their boosting action. Consequently, the output of the NAND logic gate 118b will go low (VSS), causing the pull-up transistor MP2 in the second stage 110b to turn on. This will, in turn, permit the power supply potential VDD connected to its source to pass therethrough to the internal node A2 at time t3. A fraction of the power supply potential VDD ($V_{OUT2}$=+2.0 volts) is coupled to the output node 122b and further coupled to the output node 122a of the first stage 110a via the pull-up transistor MP1 and the coupling capacitor C1 at time t4.

This boosted output voltage $V_{OUT1}$ at the output terminal 124 is given by:

$$V_{OUT} = VDD(1+\alpha_1+\alpha_1\alpha_2) \tag{5}$$

where:

$$\alpha_1 = \frac{C_1}{C_1 + C_{S1}} \tag{6}$$

$$\alpha_2 = \frac{C_2}{C_2 + C_{S2}} \tag{7}$$

If we assume that the value of the capacitor $C_1$ is 10 times greater than the capacitor $C_{S1}$ and that the value of the capacitor $C_2$ is 10 times greater than the capacitor $C_{S2}$, there are given:

$$\alpha_1 \approx 0.909 \tag{8}$$

$$\alpha_2 \approx 0.909 \tag{9}$$

Further, by assuming that the lower power supply voltage VDD to be equal to +2.0 volts, equation (5) can be simplified to:

$$V_{OUT1} = +2.0[1+0.909+(0.909)(0.909)] \tag{10}$$

$$\text{or: } \approx +5.47 \text{ volts} \tag{11}$$

Accordingly, it has been demonstrated that the recursive voltage booster circuit 110 of FIG. 2 consisting of two recursively connected boosting stages 110a and 110b is sufficient to generate the required high voltage during the Read operation in the low power supply voltage environment.

Figure 3:
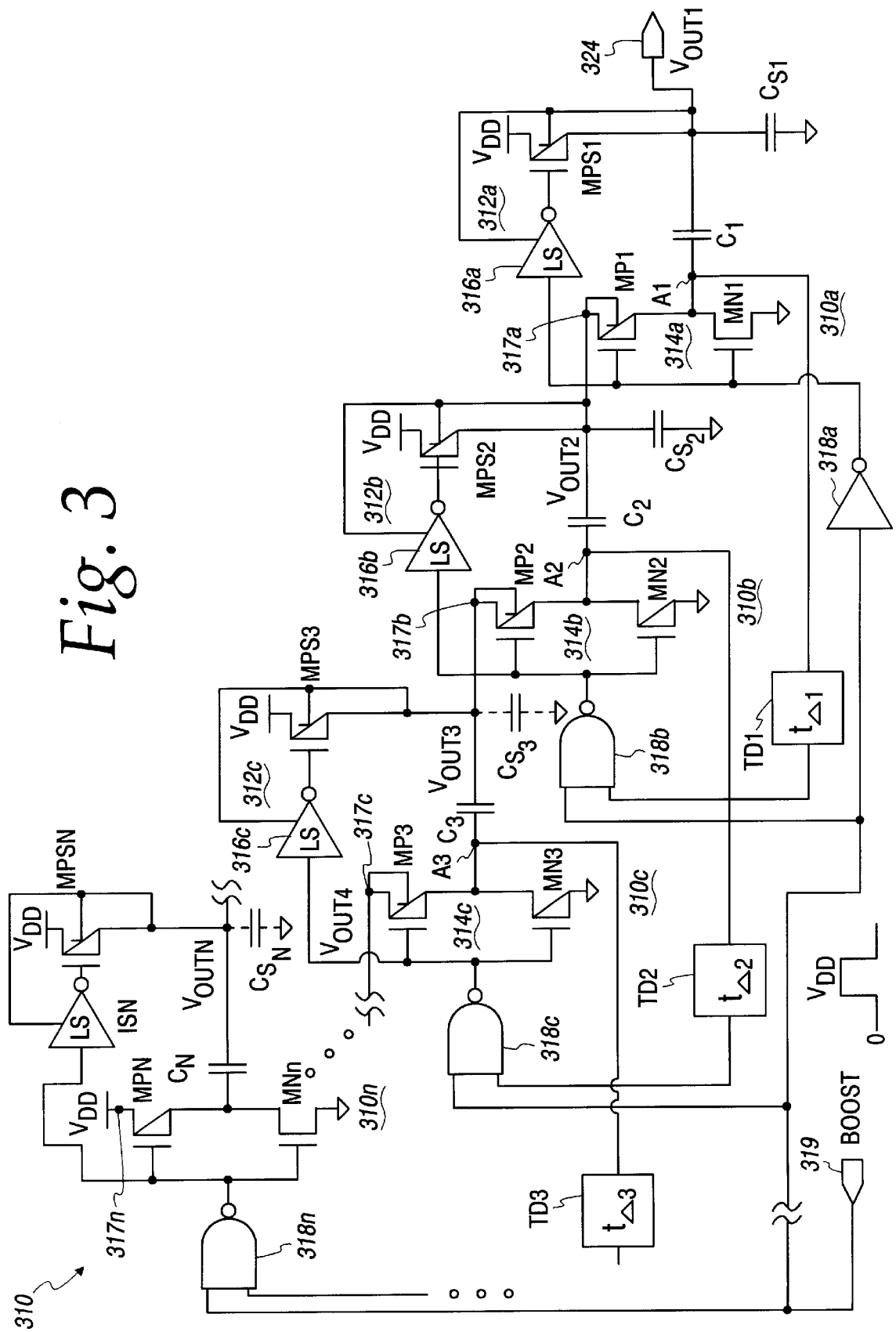
FIG. 3 is a second embodiment of a recursive voltage booster circuit having N boosting stages, in accordance with the present invention.

In FIG. 3, there is illustrated a second embodiment of a recursive voltage booster circuit 310 of the present invention which is formed of N boosting stages 310a, 310b, ... 310n, where N is any integer. It will be noted that the first stage 310a of FIG. 3 is identical in its construction and connection as the first stage 110a of FIG. 2. Also, each of the remaining stages 310b through 310n is identical in its construction and connection to the second stage 110b of FIG. 2. In particular, it can be seen that the sources at the input nodes 317a ... 317n of the pull-up transistors (i.e., MP1, MP2, ... $MP_{n-1}$) in the bootstrap portions of each stage, except for the last stage N (310n) is connected to the output node of the next higher stage (i.e., 310b through $310_{n-1}$).

The boosted output voltage of each stage at its output node in FIG. 3 can be calculated from the following expressions:

$$V_{OUT\,N} = VDD(1+\alpha_N); \tag{12}$$

$$V_{OUT\,N-1} = VDD+\alpha_{N-1}\,V_{OUT\,N}; \tag{13}$$

$$V_{OUT\,N-2} = VDD+\alpha_{N-2}\,V_{\alpha OUT\,N-1}; \tag{14}$$

$$V_{OUT2} = VDD+\alpha_2\,V_{OUT3}; \tag{15}$$

$$V_{OUT1} = VDD+\alpha_1 V_{OUT2} \tag{16}$$

By substituting equation (12) into the next equation or equation (13); equation (13) into equation (12); and so on, and by factoring out VDD, then equation (13) through equation (16) can be rewritten as follows:

$$V_{OUT\,N-1} = VDD(1+\alpha_{N-1}+\alpha_{N-1}\,\alpha_N) \tag{17}$$

$$V_{OUT\,N-2} = VDD(1+\alpha_{N-2}+\alpha_{N-2}\,\alpha_{N-1}+\alpha_{N-2}\,\alpha_{N-1}\,\alpha_N) \tag{18}$$

$$V_{OUT2} = VDD\left(1 + \alpha_2 + \alpha_2\alpha_3 + \alpha_2\alpha_3\alpha_4 + \ldots \prod_{i=2}^{N}\alpha_i\right) \tag{19}$$

$$V_{OUT1} = VDD\left(1 + \alpha_1 + \alpha_1\alpha_2 + \alpha_1\alpha_2\alpha_3 + \ldots \prod_{i=1}^{N}\alpha_i\right) \tag{20}$$

In the above equations (12) through (20), the factor $\alpha_i$ is the capacitance coupling ratio or efficiency at the i-th output node of the i-th boosting stage, which can be generally expressed as follows:

$$\alpha_i = \frac{C_i}{C_i + C_{Si}} \tag{21}$$

where:

$C_i$=is the value of booster capacitor of i-th boosting stage
$C_{Si}$=is the value of effective parasitic capacitor between i-th output node and ground In operation, it should be clearly understood that only a single input pulse BOOST is required in FIG. 3. Upon the occurrence of the low-to-high transition of the input pulse, each of the boosting stages 310*n*, 310*$_{n-1}$* . . . 310*b*, 310*a* will then be activated sequentially in a self-timed manner by action of the time delay networks or generators TDn . . . TD1. The duration of the input pulse must be sufficient so as to allow all the stages to finish their boosting action. Further, the delay times produced from the time delay generators TDn . . . TD1 must be selected so that the boosting action of a particular stage is delayed until the previous stage has completed its boosting action. This will serve to improve the boosting efficiency of each stage. Each of the generators TDn . . . TD1 may be formed of a plurality of CMOS inverters.

Accordingly, the output voltage of each stage will be boosted successively higher beginning with the n-th stage (310*n*) so that the output or first stage 310*a* will be boosted to the highest voltage level, as determined by above equation (20). When the input pulse BOOST makes the high-to-low transition at time t5, the output node of each stage will be discharged back down to the lower power supply potential VDD via the respective precharge transistors MPS1, MPS2, . . . MPSn.

With reference again to equation (20), it will be observed that the contribution made to the boosted output voltage $V_{OUT1}$ decreases rapidly with each successively increasing stage. For example, in the third term the coupling efficiency $\alpha_2$ for the second stage 310*b* is multiplied by the coupling efficiency $\alpha_1$ of the first stage 310*a*. Similarly, in the fourth term the coupling efficiency $\alpha_3$ for the third stage is multiplied by the coupling efficiencies $\alpha_1$ and $\alpha_2$, and so on. Therefore, since the coupling efficiency for each stage is less than 1 ($\alpha_i<1$) then the contributions made from the higher stages in the chain are quickly attenuated. As a consequence, it is generally not feasible in practice to implement a recursive voltage booster circuit formed with more than three stages.

From the foregoing detailed description, it can thus be seen that the present invention provides an improved voltage booster circuit which includes a plurality of recursively connected boosting stages for generating a boosted output voltage to drive control gates via row decoder circuits and wordlines in an array of Flash EEPROM memory cells during a Read mode of operation. The present voltage booster circuit produces the boosted output voltage that is significantly higher than what is traditionally available in a very low power supply voltage environment. The voltage booster circuit of the present invention is still operational when the lower power supply potential is +2.0 volts or lower.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

I claim:

1. A recursive voltage booster circuit for generating a boosted output voltage to be higher than a low power supply potential to drive control gates via row decoder circuits and wordlines in an array of Flash EEPROM memory cells during a Read mode of operation, said booster circuit comprising:

a plurality of recursively connected boosting stages being joined together in a chain from a last stage to a first stage;

each boosting stage being formed of a precharge portion and a bootstrap portion;

said precharge portion including a level-shifting inverter and a precharge transistor responsive to a single input pulse for selectively connecting a low power supply potential to an output node;

said bootstrap portion including a P-channel pull-up transistor, an N-channel pull-down transistor, and a bootstrap capacitor, said P-channel and N-channel transistors having their gates connected together at a first input node and having their drains connected together at an internal boost node, said P-channel transistor having its source connected to a second input node, said N-channel transistor having its source connected to a ground potential, said booster capacitor being inter-connected between said boost node and said output node;

logic gate means being interconnected between an input terminal for receiving the input pulse and said first input node;

time delay means being interconnected between said boost node and said logic gate means of a preceding boosting stage for delaying its boosting action at said boost node until the preceding boosting stage has completed its boosting action;

said second input node of each boosting stage except for the last boosting stage being connected to a respective output node of the preceding stage;

said second input node of said last boosting stage being connected to the lower power supply potential; and said output node of the first boosting stage generating said boosted output voltage.

2. A recursive voltage booster circuit as claimed in claim 1, wherein said lower power supply potential has a voltage of +2.0 volts or lower.

3. A recursive voltage booster circuit as claimed in claim 2, wherein said boosted output voltage has a voltage of +5.0 volts or more when said lower power supply potential is at +2.0 volts.

4. A recursive voltage booster circuit as claimed in claim 3, wherein said boosted output voltage is given by:

$$V_{OUT1} = VDD\left(1 + \alpha_1 + \alpha_1\alpha_2 + \alpha_1\alpha_2\alpha_3 + \ldots \prod_{i=1}^{N}\alpha_i\right)$$

where:

$$\alpha_i = \frac{C_i}{C_i + C_{Si}}$$

$C_i$=is the value of booster capacitor of i-th boosting stage $C_{Si}$=is the value of effective parasitic capacitor between I-th output node and ground.

5. A recursive voltage booster circuit as claimed in claim 1, wherein said logic gating means of each boosting stage except for the first boosting stage is comprised of a two-input NAND logic gate.

6. A recursive voltage booster circuit as claimed in claim 5, wherein said logic means for the first boosting stage is a CMOS inverter.

7. A recursive voltage booster circuit as claimed in claim 1, wherein said time delay means is comprised of a time delay generator.

8. A recursive voltage booster circuit as claimed in claim 7, wherein said time delay generator is formed of CMOS inverters.

9. A recursive voltage booster circuit as claimed in claim 1, wherein said plurality of boosting stages is comprised of two boosting stages.

10. A recursive voltage booster circuit as claimed in claim 1, wherein said plurality of boosting stages is comprised of three boosting stages.

11. A recursive voltage booster circuit as claimed in claim 1, wherein said plurality of boosting stages is comprised of N boosting stages, where N is any integer.

12. A recursive voltage booster circuit as claimed in claim 5, wherein said NAND logic gate has a first input connected to receive said input pulse, a second input connected to said time delay means, and an output connected to said first input node.

* * * * *